United States Patent
Onodera et al.

(10) Patent No.: US 11,018,105 B2
(45) Date of Patent: May 25, 2021

(54) SEMICONDUCTOR DEVICE AND METHOD OF MANUFACTURING THE SAME

(71) Applicant: Cypress Semiconductor Corporation, San Jose, CA (US)

(72) Inventors: Masanori Onodera, Tokyo (JP); Junichi Kasai, Kanagawa (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/601,837

(22) Filed: Oct. 15, 2019

(65) Prior Publication Data

US 2020/0058610 A1 Feb. 20, 2020

Related U.S. Application Data

(63) Continuation of application No. 15/336,926, filed on Oct. 28, 2016, now abandoned, which is a (Continued)

(30) Foreign Application Priority Data

Feb. 28, 2007 (JP) .................................. 2007-048693

(51) Int. Cl.
*H01L 23/48* (2006.01)
*H01L 23/00* (2006.01)
(Continued)

(52) U.S. Cl.
CPC .............. *H01L 24/08* (2013.01); *H01L 21/56* (2013.01); *H01L 21/6835* (2013.01); *H01L 23/293* (2013.01); *H01L 23/3107* (2013.01); *H01L 23/49838* (2013.01); *H01L 23/5388* (2013.01); *H01L 24/03* (2013.01); *H01L 24/17* (2013.01); *H01L 24/19* (2013.01); *H01L 24/97* (2013.01); *H01L 21/568* (2013.01); *H01L 2221/68345* (2013.01); *H01L 2224/02333* (2013.01); *H01L 2224/04105* (2013.01); *H01L 2224/12105* (2013.01); *H01L 2224/19* (2013.01); *H01L 2224/20* (2013.01); *H01L 2224/32225* (2013.01); *H01L 2224/73267* (2013.01); *H01L 2224/92244* (2013.01); *H01L 2224/97* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); (Continued)

(58) Field of Classification Search
CPC ..... H01L 23/28; H01L 23/3107; H01L 24/09; H01L 24/17; H01L 2224/0233
USPC ........................................................ 257/737
See application file for complete search history.

(56) References Cited

U.S. PATENT DOCUMENTS 5,616,958 A 4/1997 Laine et al.
5,851,911 A 12/1998 Farnworth
(Continued)

OTHER PUBLICATIONS

USPTO Advisory Action for U.S. Appl. No. 12/039,511 dated Mar. 29, 2016; 2 pages.
(Continued)

*Primary Examiner* — Nitin Parekh

(57) ABSTRACT

A semiconductor device includes a semiconductor chip, a bump contract, and encapsulating layer, an insulating layer, and a connection terminal.

8 Claims, 8 Drawing Sheets

Related U.S. Application Data continuation of application No. 12/039,511, filed on Feb. 28, 2008, now Pat. No. 9,508,651.

(51) Int. Cl.
| | | |
|---|---|---|
| *H01L 21/683* | (2006.01) | |
| *H01L 23/498* | (2006.01) | |
| *H01L 23/538* | (2006.01) | |
| *H01L 21/56* | (2006.01) | |
| *H01L 23/29* | (2006.01) | |
| *H01L 23/31* | (2006.01) | |

(52) U.S. Cl.
CPC ............... *H01L 2924/01075* (2013.01); *H01L 2924/01078* (2013.01); *H01L 2924/01079* (2013.01); *H01L 2924/14* (2013.01); *H01L 2924/15311* (2013.01); *H01L 2924/15787* (2013.01); *H01L 2924/18162* (2013.01)

(56) References Cited

U.S. PATENT DOCUMENTS

| | | | |
|---|---|---|---|
| 5,990,546 | A | 11/1999 | Igarashi et al. |
| 6,013,953 | A * | 1/2000 | Nishihara ......... H01L 23/49838 257/778 |
| 6,236,112 | B1 | 5/2001 | Horiuchi et al. |
| 6,281,046 | B1 | 8/2001 | Lam |
| 6,350,668 | B1 * | 2/2002 | Chakravorty ....... H01L 23/3114 438/612 |
| 6,353,263 | B1 | 3/2002 | Dotta et al. |
| 6,462,410 | B1 * | 10/2002 | Novotny ................. H01L 23/34 257/704 |
| 6,498,389 | B1 | 12/2002 | Kim |
| 6,518,089 | B2 | 2/2003 | Coyle |
| 7,675,157 | B2 | 3/2010 | Liu et al. |
| 9,508,651 | B2 | 11/2016 | Onodera et al. |
| 2001/0003049 | A1 | 6/2001 | Fukasawa et al. |
| 2002/0159242 | A1 | 10/2002 | Nakatani et al. |
| 2003/0127715 | A1 * | 7/2003 | Liu ..................... H01L 21/4871 257/678 |
| 2003/0197281 | A1 | 10/2003 | Farnworth et al. |
| 2004/0032013 | A1 | 2/2004 | Cobbley et al. |
| 2004/0090829 | A1 | 5/2004 | Miura et al. |
| 2004/0145051 | A1 * | 7/2004 | Klein ................. H01L 25/0652 257/734 |
| 2004/0188819 | A1 | 9/2004 | Farnworth et al. |
| 2004/0195686 | A1 | 10/2004 | Jobetto et al. |
| 2004/0232543 | A1 | 11/2004 | Goller et al. |
| 2005/0012225 | A1 * | 1/2005 | Choi .................. H01L 23/3114 257/782 |
| 2005/0017368 | A1 | 1/2005 | Mertol et al. |
| 2005/0019982 | A1 | 1/2005 | Wakabayashi et al. |
| 2005/0098891 | A1 | 5/2005 | Wakabayashi et al. |
| 2005/0124093 | A1 | 6/2005 | Yang et al. |
| 2005/0124147 | A1 | 6/2005 | Shiu et al. |
| 2005/0265412 | A1 * | 12/2005 | Ueki .................. H01S 5/18377 372/43.01 |
| 2006/0021791 | A1 | 2/2006 | Sunohara et al. |
| 2006/0030150 | A1 | 2/2006 | Jiang et al. |
| 2006/0131745 | A1 | 6/2006 | Yutani |
| 2006/0138674 | A1 | 6/2006 | Huang et al. |
| 2006/0214153 | A1 | 9/2006 | Ikezawa et al. |
| 2006/0237827 | A1 | 10/2006 | Wu et al. |
| 2006/0252232 | A1 | 11/2006 | Usui et al. |
| 2007/0018308 | A1 | 1/2007 | Schott et al. |
| 2007/0045872 | A1 | 3/2007 | Fee |
| 2007/0075435 | A1 | 4/2007 | Suminoe et al. |
| 2007/0114661 | A1 | 5/2007 | Choi et al. |
| 2007/0130764 | A1 | 6/2007 | Nebashi et al. |
| 2007/0158809 | A1 | 7/2007 | Chow et al. |
| 2007/0164424 | A1 * | 7/2007 | Dean ...................... H01L 23/42 257/707 |
| 2007/0178622 | A1 | 8/2007 | Liu et al. |
| 2007/0196612 | A1 | 8/2007 | Igarashi |
| 2007/0246826 | A1 | 10/2007 | Chung et al. |
| 2008/0012152 | A1 | 1/2008 | Meyer et al. |
| 2008/0088004 | A1 | 4/2008 | Yang et al. |
| 2008/0284012 | A1 * | 11/2008 | Okayama .............. H01L 21/561 257/737 |
| 2009/0200651 | A1 | 8/2009 | Kung et al. |
| 2011/0275176 | A1 | 11/2011 | Veen et al. |

OTHER PUBLICATIONS

USPTO Advisory Action for U.S. Appl. No. 12/039,511 dated Jun. 9, 2015; 3 pages.
USPTO Final Rejection for U.S. Appl. No. 12/039,511 dated Feb. 8, 2016; 32 pages.
USPTO Final Rejection for U.S. Appl. No. 12/039,511 dated Mar. 2, 2011; 11 pages.
USPTO Final Rejection for U.S. Appl. No. 12/039,511 dated May 11, 2015; 11 pages.
USPTO Final Rejection for U.S. Appl. No. 12/039,511 dated Jun. 17, 2014; 23 pages.
USPTO Final Rejection for U.S. Appl. No. 12/039,511 dated Jul. 9, 2013; 12 pages.
USPTO Final Rejection for U.S. Appl. No. 12/039,511 dated Dec. 18, 2013; 13 pages.
USPTO Final Rejection for U.S. Appl. No. 15/336,926 dated Jun. 28, 2019; 26 pages.
USPTO Final Rejection for U.S. Appl. No. 15/336,926 dated Jul. 26, 2018; 14 pages.
USPTO Final Rejection for U.S. Appl. No. 15/336,926 dated Aug. 16, 2017; 13 pages.
USPTO Non-Final Rejection for U.S. Appl. No. 12/039,511 dated Mar. 20, 2014; 16 pages.
USPTO Non-Final Rejection for U.S. Appl. No. 12/039,511 dated Apr. 17, 2013; 11 pages.
USPTO Non-Final Rejection for U.S. Appl. No. 12/039,511 dated May 25, 2016; 31 pages.
USPTO Non-Final Rejection for U.S. Appl. No. 12/039,511 dated Sep. 29, 2010; 13 pages.
USPTO Non-Final Rejection for U.S. Appl. No. 12/039,511 dated Oct. 2, 2015; 23 pages.
USPTO Non-Final Rejection for U.S. Appl. No. 12/039,511 dated Oct. 8, 2013; 19 pages.
USPTO Non-Final Rejection for U.S. Appl. No. 12/039,511 dated Dec. 8, 2014; 22 pages.
USPTO Non-Final Rejection for U.S. Appl. No. 15/336,926 dated Feb. 8, 2018; 10 pages.
USPTO Non-Final Rejection for U.S. Appl. No. 15/336,926 dated Apr. 10, 2017; 10 pages.
USPTO Non-Final Rejection for U.S. Appl. No. 15/336,926 dated Dec. 3, 2018; 20 pages.
USPTO Notice of Allowance for U.S. Appl. No. 12/039,511 dated Aug. 22, 2016; 9 pages.

* cited by examiner

SEMICONDUCTOR DEVICE AND METHOD OF MANUFACTURING THE SAME

RELATED APPLICATION

The present application is a continuation application of U.S. Non-Provisional application Ser. No. 15/336,926, filed on Oct. 28, 2016, which claims priority to U.S. Non-Provisional application Ser. No. 12/039,511, filed on Feb. 28, 2008, now U.S. Pat. No. 9,508,651, issued on Nov. 29, 2016, which claims priority to Japanese Patent Application No. 2007-048693 filed on Feb. 28, 2007, all of which are incorporated by reference herein in their entirety.

TECHNICAL FIELD

This invention generally relates to a semiconductor device and a method of manufacturing the semiconductor device, and in particular, relates to a small scale semiconductor device and method of manufacturing the semiconductor device.

BACKGROUND OF THE INVENTION

Recently, there is a demand for downsizing a semiconductor device that is used for a portable electronic device such as a mobile phone or a nonvolatile record media of an IC memory card. A wafer level package (CSP) is being developed in an art where a semiconductor device is downsized.

A flip chip ball grid array (FC-BGA) is used in a conventional art of the wafer level package. A plurality of semiconductor chips are flip-chip mounted on a glass epoxy substrate and the semiconductor chips are resin-sealed with molding using an epoxy resin in order to manufacture semiconductor devices of the wafer level package. After that, an outer connection electrode such as a solder ball is connected to the glass epoxy substrate. And each of the semiconductor chips is cut off with dicing. With the manufacturing method, the wafer level package is manufactured. In accordance with the manufacturing method, a quantity of the semiconductor chips to be mounted gets larger as an area of the glass epoxy substrate gets larger. A manufacturing cost of the semiconductor device may be therefore reduced because the quantity of the semiconductor chips that are cut off with one dicing gets larger.

Japanese Patent Application Publication No. 2001-250902 (hereinafter referred to as Document 1) discloses a wafer level package in which a semiconductor chip is implanted in a ceramics substrate having a recess and a redistribution layer (RDL) is formed on the semiconductor chip. The invention disclosed in Document 1 is characterized in that the ceramics substrate having the recess is used instead of the glass epoxy substrate.

Japanese Patent Application Publication No. 2004-221417 (hereinafter referred to as Document 2) discloses a wafer level package in which a sheet-shaped insulating film having an opening according to the size of the semiconductor chip is used, the semiconductor chip is implanted in the opening, and a redistribution layer is formed on the semiconductor chip. The invention disclosed in Document 2 is characterized in that the sheet-shaped insulating film having the opening is used instead of the glass epoxy substrate and the outer connection electrode is connected to the semiconductor chip through two redistribution layers.

In accordance with the manufacturing method of the conventional art, the glass epoxy substrate may be warped because of heat generated during molding, if a large area glass epoxy substrate is used. A yield ratio of the semiconductor device may be reduced, because a problem is made in reliability of the semiconductor device when the glass epoxy substrate is warped. It is therefore difficult to use the large area glass epoxy substrate. Reduction of the manufacturing cost is limited. The glass epoxy substrate needs a certain thickness. The semiconductor chip is not able to be flip-chip mounted if the semiconductor chip does not have a certain thickness. A reduction of the height of the semiconductor device may be limited approximately 1 mm.

In accordance with the invention disclosed in Document 1, the manufacturing cost gets higher because it is necessary to form a recess on the ceramics substrate. And in accordance with the invention disclosed in Document 2, it is necessary that an insulating film should be provided according to the size of the built-in semiconductor chip. Therefore, the manufacturing cost gets higher when various kinds of the wafer level packages are manufactured. The height of the semiconductor device gets higher, because two redistribution layers are necessary and the quantity of components is large.

SUMMARY OF THE INVENTION

The present invention provides a semiconductor device having a low height and a low manufacturing cost and provides a method of manufacturing the semiconductor device.

According to an aspect of the present invention, preferably, there is provided a semiconductor device including a semiconductor chip, a bump electrode, a molding portion, a redistribution layer, and an outer connection electrode. The bump electrode is provided on an upper face of the semiconductor chip. The molding portion encapsulates an entire side face of the semiconductor chip and seals the bump electrode so that a part of the bump electrode is exposed. The redistribution layer is provided on an upper face of the molding portion and is electrically coupled to the semiconductor chip via the bump electrode. The outer connection electrode is provided on an upper face of the redistribution layer and is electrically coupled to the bump electrode via the redistribution layer. With the structure, the semiconductor device may be electrically coupled to outside with one redistribution layer. Therefore, the semiconductor device needs fewer components, compared to a semiconductor device that needs two redistribution layers in accordance with Document 2. It is therefore possible to reduce a manufacturing cost of the semiconductor device. Further, it is possible to reduce a height of the semiconductor device compared to a semiconductor device having two redistribution layers, because the semiconductor device needs only one redistribution layer.

DETAILED DESCRIPTION

A description will now be given of best modes for carrying out the present invention.

First Embodiment

Figure 1:
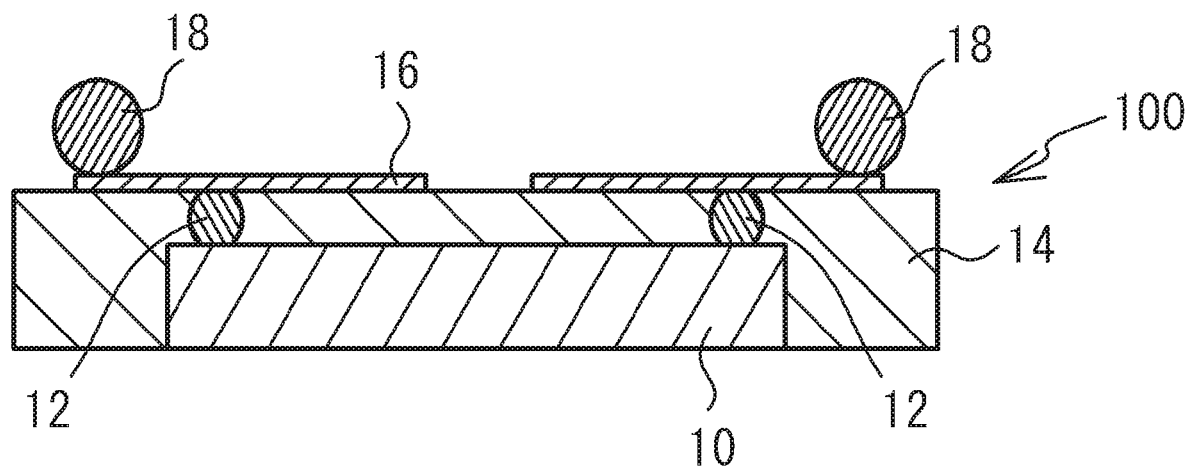
FIG. 1 is a schematic cross sectional view of a semiconductor device in accordance with a first embodiment.

FIG. 1 illustrates a schematic cross sectional view of a semiconductor device 100 in accordance with a first embodiment. As shown in FIG. 1, the semiconductor device 100 has a semiconductor chip 10, a bump electrode 12, a molding portion 14, a redistribution layer 16 and an outer connection electrode 18.

The semiconductor chip 10 is made of silicon or the like. There is provided the bump electrode 12 on an upper face of the semiconductor chip 10. The bump electrode 12 is made of Au (gold), a solder or the like, and has a height of approximately 300 μm. The molding portion 14 seals an entire side face of the semiconductor chip 10 and seals the bump electrode 12 so that a part of the bump electrode 12 is exposed. The molding portion 14 is made of an epoxy resin or the like. The molding portion 14 restrains a breaking of the semiconductor chip 10 caused by an impact from outside. There is provided the redistribution layer 16 on an upper face of the molding portion 14. The redistribution layer 16 is made of copper or the like. The redistribution layer 16 is formed with a plating method, a sputtering method or the like. The redistribution layer 16 is electrically coupled to the semiconductor chip 10 via the bump electrode 12. There is provided the outer connection electrode 18 on an upper face of the redistribution layer 16 so as to be electrically coupled to the bump electrode 12 via the redistribution layer 16. The outer connection electrode 18 is made of Au, a solder or the like, and has a height of approximately 300 μm. The outer connection electrode 18 acts as a connection terminal when the semiconductor device 100 is connected to an external circuit substrate or the like.

The semiconductor device 100 may be electrically coupled to outside with one redistribution layer. The semiconductor device 100 needs fewer components, compared to a semiconductor device that needs two redistribution layers in accordance with Document 2. It is therefore possible to reduce a manufacturing cost of the semiconductor device 100. Further, it is possible to reduce a height of the semiconductor device 100 compared to a semiconductor device having two redistribution layers, because the semiconductor device 100 needs only one redistribution layer.

It is preferable that the upper face of the bump electrode 12 and the upper face of the molding portion 14 (a face where the redistribution layer 16 is to be provided) are flat. It is possible to form the redistribution layer accurately on the upper face of the molding portion 14 with the sputtering method, the plating method or the like, when the upper face of the bump electrode 12 and the molding portion 14 is flat. It is therefore possible to improve a yield ratio of the semiconductor device 100. And it is possible to reduce the manufacturing cost of the semiconductor device 100.

Figure 2A:
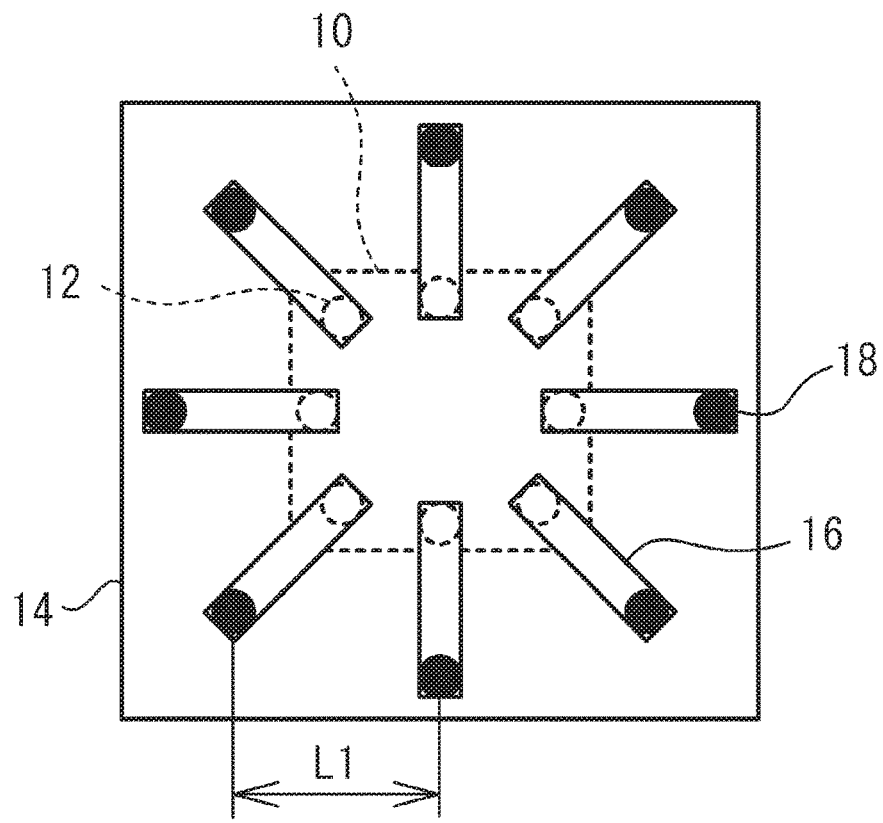
FIG. 2A and FIG. 2B illustrate a schematic diagram accounting for an interval between each outer connection terminal and an interval between each bump electrode of the semiconductor device in accordance with the first embodiment.
Figure 2B:
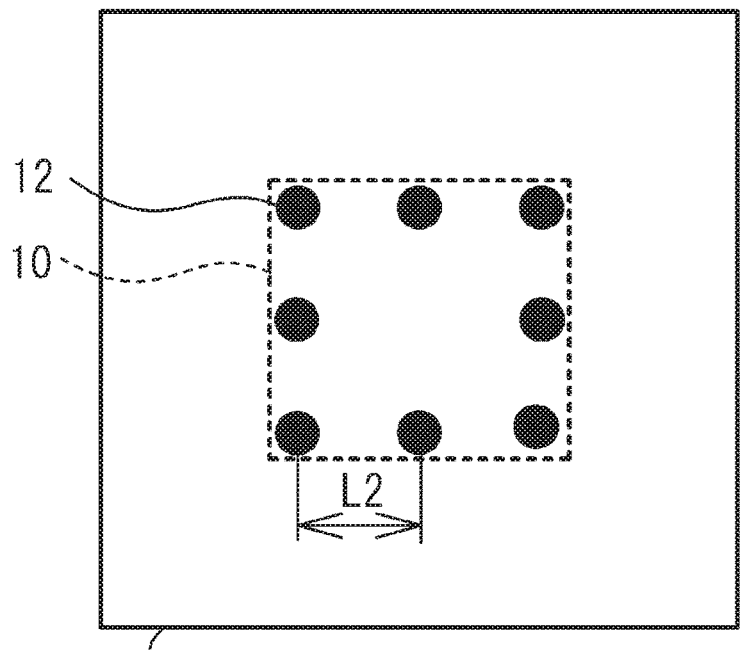

It is preferable that an interval between each of the outer connection electrodes 18 is larger than that between each of the bump electrodes 12. FIG. 2A illustrates a top view of the semiconductor device 100 shown in FIG. 1. FIG. 2B illustrates a schematic view of the semiconductor device 100 shown in FIG. 2A in a case where the redistribution layer 16 and the outer connection electrode 18 are not provided. In FIG. 2B, the bump electrode 12 acts as an outer connection electrode. In FIG. 2A and FIG. 2B, intervals between each of the outer connection electrodes and bump electrodes are referred to as "L1" and "L2" respectively.

As shown in FIG. 2A and FIG. 2B, the L1 shown in FIG. 2A is longer than the L2 shown in FIG. 2B. Generally, the L2 is reduced, when the semiconductor chip 10 is miniaturized as the semiconductor device is downsized. However, it is not easy to reduce an interval between connection terminals of the circuit substrate on the side of the semiconductor device according to the L2, even if the L2 is reduced. On the other hand, as shown in FIG. 2A and FIG. 2B, it is easy to determine a position of the semiconductor device 100 at an external circuit substrate when the semiconductor device 100 is mounted on the circuit substrate even if the semiconductor chip 10 is miniaturized, if the L1 is longer than the L2. And it is possible to restrain an electrical short between each of the outer connection electrodes 18 because the L1 is long. It is therefore possible to use the outer connection electrode 18 having a larger size. It is therefore possible to improve connection strength in a case where the semiconductor device 100 is mounted on an external circuit substrate.

Second Embodiment

Figure 3:
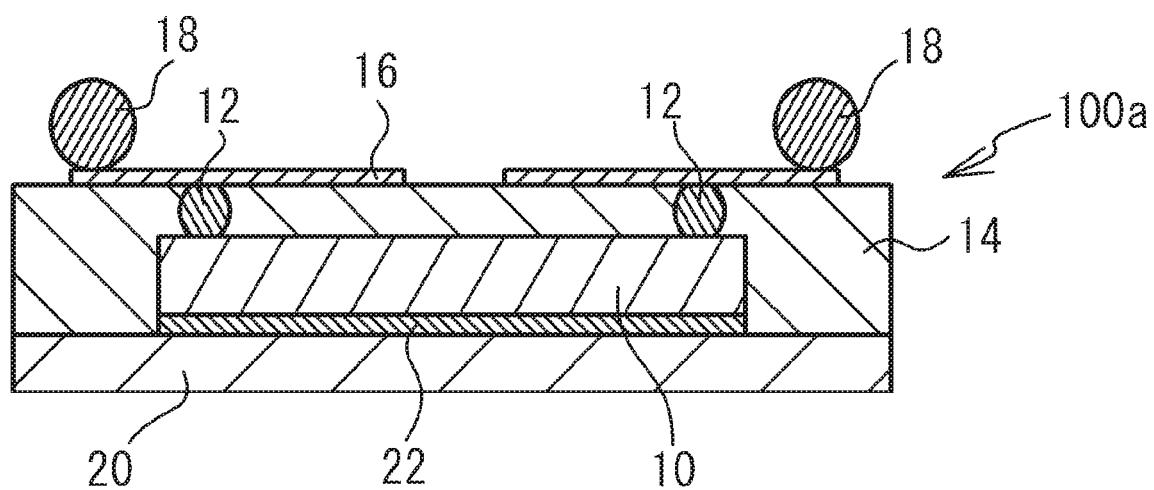
FIG. 3 illustrates a schematic cross sectional view of a semiconductor device in accordance with a second embodiment.

A description will be given of a semiconductor device 100a in accordance with a second embodiment. FIG. 3 illustrates a schematic cross sectional view of the semiconductor device 100a in accordance with the second embodiment. The semiconductor device 100a is different from the semiconductor device 100 shown in FIG. 1 in a point that a substrate 20 is further provided on a lower face of the semiconductor chip 10. The other structure is the same as that shown in FIG. 1. And an explanation of the structure is omitted.

As shown in FIG. 3, the substrate 20 is fixed to the lower face of the semiconductor chip 10 with a fixing portion 22. The fixing portion 22 is made of an adhesive resin such as an epoxy resin or the like.

The semiconductor device 100a may be electrically connected to outside with one redistribution layer 16. Therefore, the semiconductor device 100a needs fewer components, compared to a semiconductor device in accordance with Document 2. It is therefore possible to reduce a manufacturing cost of the semiconductor device 100a. Further, it is possible to reduce a height of the semiconductor device 100a compared to the semiconductor device in accordance with Document 2, because the semiconductor device 100a has one redistribution layer 16.

It is preferable that the substrate 20 is a silicon substrate. A warpage amount of a silicon substrate caused by heat is less than that of a glass epoxy substrate. It is therefore possible to manufacture a plenty of the semiconductor devices 100*a* all together if the silicon substrate is used. It is therefore possible to reduce the manufacturing cost of the semiconductor device 100*a*.

Third Embodiment

Figure 4:
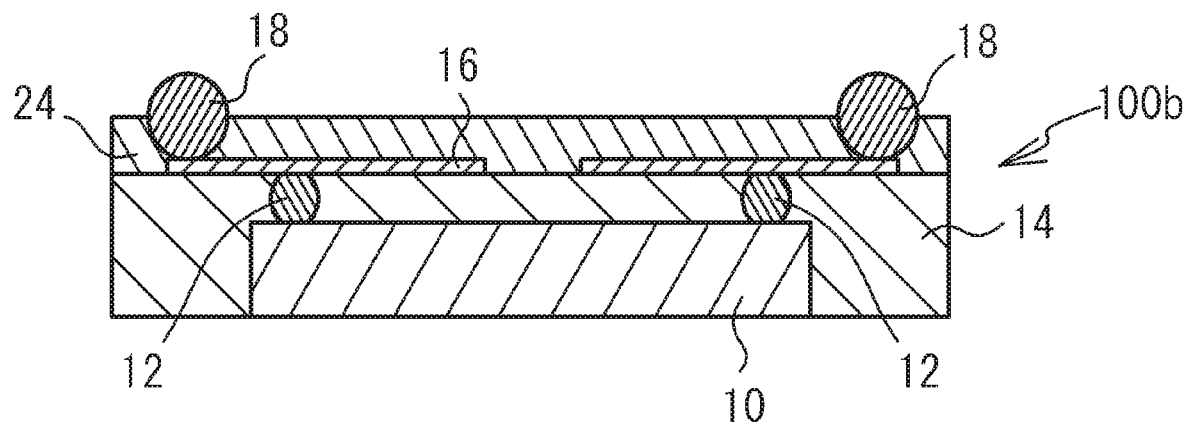
FIG. 4 illustrates a schematic cross sectional view of a semiconductor device in accordance with a third embodiment.

A description will be given of a semiconductor device 100*b* in accordance with a third embodiment. FIG. 4 illustrates a schematic cross sectional view of the semiconductor device 100*b* in accordance with the third embodiment. The semiconductor device 100*b* is different from the semiconductor device 100 shown in FIG. 1 in a point that an insulating portion 24 is further provided. The other structure is the same as that shown in FIG. 1. And an explanation of the structure is omitted.

As shown in FIG. 4, the insulating portion 24 is formed so that the insulating portion 24 covers the entire side face and the entire upper face of the redistribution layer 16 and a part of the outer connection electrode 18 is exposed. The insulating portion 24 is made of a resin or the like such as polyimide or the like.

In accordance with the semiconductor device 100*b*, it is possible to restrain an electrical short between each of the outer connection electrodes 18, because the insulating portion 24 is provided. The yield ratio of the semiconductor device 100*b* may be therefore improved and the manufacturing cost may be reduced.

The insulating portion 24 may be formed so that the insulating portion 24 covers the entire side face and the entire upper face of the redistribution layer 16 and a part of the outer connection electrode 18 is exposed in the semiconductor device 100*a* in accordance with the second embodiment shown in FIG. 3. In this case, it is possible to restrain the electrical short between each of the outer connection electrodes 18 with the insulating portion 24.

Fourth Embodiment

In a fourth embodiment, a description will be given of a method of manufacturing the semiconductor device in accordance with the above-mentioned embodiment. The manufacturing method in accordance with the fourth embodiment includes a step of forming a bump electrode on a semiconductor chip, a step of fixing the semiconductor chip on a substrate, a step of forming a molding portion, a step of forming a redistribution layer and a step of forming an outer connection electrode. FIG. 5A through FIG. 5E, FIG. 6A through FIG. 6C, FIG. 7A, FIG. 7B and FIG. 8 illustrate a schematic cross sectional view accounting for the manufacturing method of the semiconductor device in accordance with the fourth embodiment.

Figure 5A:
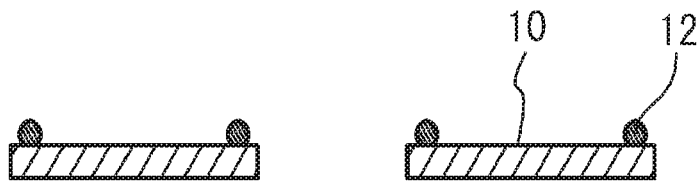
FIG. 5A, FIG. 5B, FIG. 5C, FIG. 5D, and FIG. 5E illustrate a schematic cross sectional view accounting for a method of manufacturing a semiconductor device in accordance with a fourth embodiment.

As shown in FIG. 5A, the bump electrode 12 made of Au, a solder or the like is formed on the upper face of the semiconductor chip 10 made of silicon or the like.

Figure 5B:
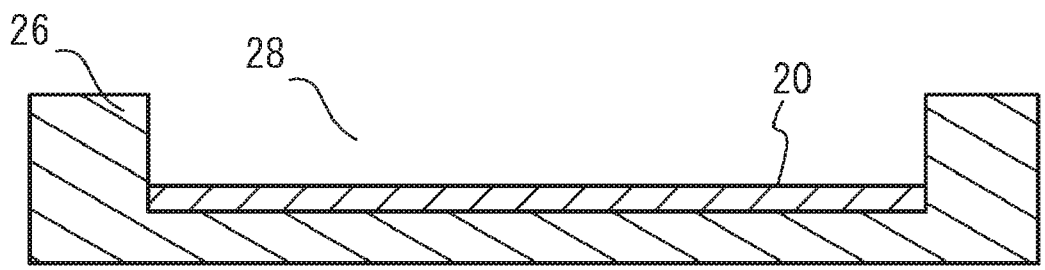

Next, as shown in FIG. 5B, the substrate 20 having a wafer shape is arranged in a mold 26 having a recess 28. The mold 26 is not limited in particular. The mold 26 may be a metallic mold. It is preferable that the substrate 20 is a silicon substrate. A warpage amount of a silicon substrate caused by heat is less than that of a glass epoxy substrate. It is therefore possible to use a silicon substrate that is a large area wafer. It is therefore possible to manufacture a plenty of the semiconductor devices all together if the silicon substrate is used. And it is possible to reduce the manufacturing cost of the semiconductor device.

Figure 5C:
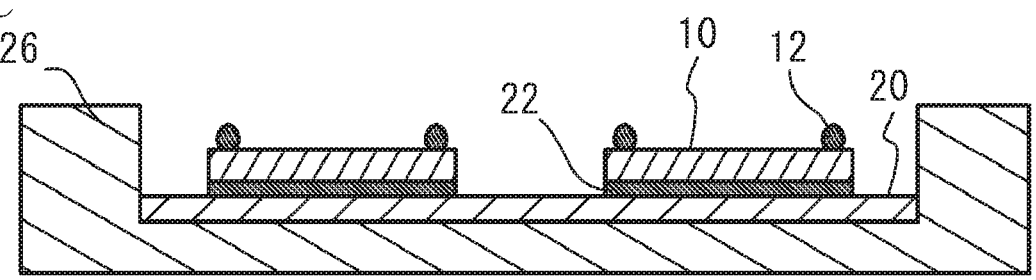

Next, as shown in FIG. 5C, the semiconductor chip 10 is fixed to the upper face of the substrate 20 with the fixing portion 22. The fixing portion 22 may be made of an adhesive resin or the like such as an epoxy resin.

Figure 5D:
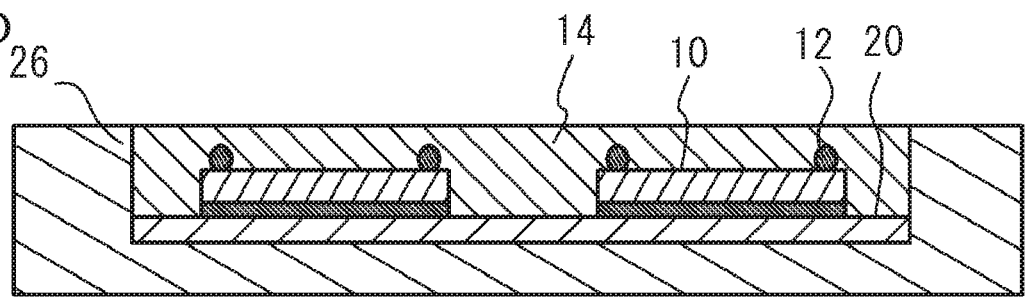

Next, as shown in FIG. 5D, the entire of the semiconductor chip 10 and the entire of the bump electrode 12 are sealed with an epoxy resin or the like, and are molded. Thus the molding portion 14 is formed.

In accordance with the manufacturing method, the substrate 20 having the wafer shape is arranged in the metallic mold 26 having the recess 28, and is sealed. It is therefore not necessary to provide the metallic mold 26 according to the size of each semiconductor device having different size from each other, when a various kinds of the semiconductor devices are manufactured. It is further possible to manufacture a plenty of the semiconductor devices, compared to a case where each semiconductor chip is arranged in each recess of a wafer as is the case of the manufacturing method disclosed in Document 1. It is therefore possible to reduce the manufacturing cost of the semiconductor device. In the manufacturing method disclosed in Document 1, a metallic mold having a recess is not used, but a ceramics substrate having a recess is used in a sealing step. Here, manufacturing the metallic mold 26 having the recess 28 is less expensive than manufacturing the ceramics substrate having the recess. With the method in accordance with the embodiment, it is therefore possible to reduce the manufacturing cost of the semiconductor device, compared to the manufacturing method disclosed in Document 1.

Figure 5E:
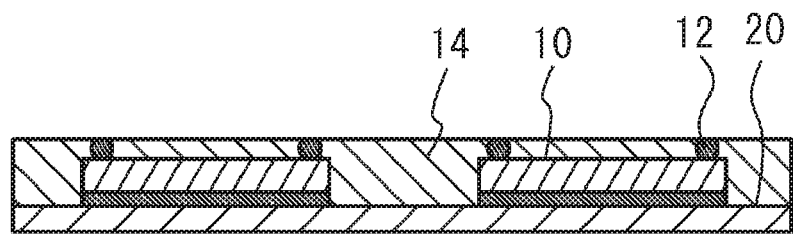

Next, as shown in FIG. 5E, the sealed semiconductor chip 10 and so on is extracted from the metallic mold 26. And the molding portion 14 is fabricated so that a part of the upper face of the bump electrode 12 is exposed. A machining process such as grinding process may be used during the fabrication of the molding portion 14. It is therefore possible to form the molding portion 14 so that the molding portion 14 seals the entire of the semiconductor chip 10 and a part of the bump electrode 12 is exposed, by fabricating the molding portion 14 so that a part of the upper face of the bump electrode 12 is exposed.

It is preferable that the molding portion 14 is fabricated so that the upper face of the molding portion 14 and the upper face of the bump electrode 12 get flat. It is possible to form the redistribution layer accurately on the upper face of the molding portion 14 with the sputtering method, the plating method or the like as described later, if the upper face of the molding portion 14 and the upper face of the bump electrode 12 are fabricated to be flat. It is therefore possible to improve the yield ratio of the semiconductor device and to reduce the manufacturing cost of the semiconductor device.

In the fourth embodiment, as shown in FIG. 5E, a description is given of a method of fabricating the molding portion 14 so that a part of the upper face of the bump electrode 12 is exposed, as a method of forming the molding portion 14 so that the molding portion 14 covers the entire of the semiconductor chip 10 and a part of the bump electrode 12 is exposed. However, the fabrication of the molding portion 14 is not always necessary if the molding portion 14 having the same structure can be formed. However, it is possible to fabricate the molding portion 14 so that the upper face of the molding portion 14 and the upper face of the bump electrode 12 get flat in the step of fabricating the molding portion 14 and to form the redistribution layer accurately, if the method includes the step of fabricating the molding portion 14. It is possible to reduce the manufacturing cost, because the yield ratio is improved if the method includes the step of fabricating the molding portion 14.

Figure 6A:
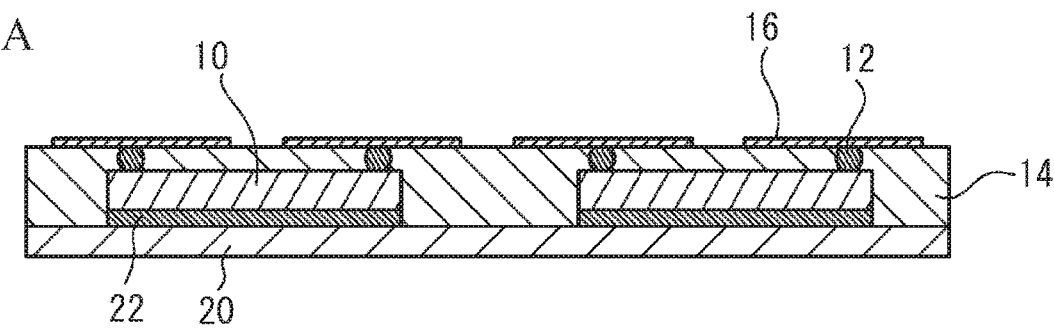
FIG. 6A, 6B and FIG. 6C illustrate a schematic cross sectional view accounting for the method of manufacturing the semiconductor device in accordance with the fourth embodiment.

Next, as shown in FIG. 6A, there is formed the redistribution layer 16 on the upper face of the molding portion 14 so as to be electrically coupled to the bump electrode 12. The redistribution layer 16 is made of copper or the like, and is formed with the sputtering method, the plating method or the like.

Figure 6B:
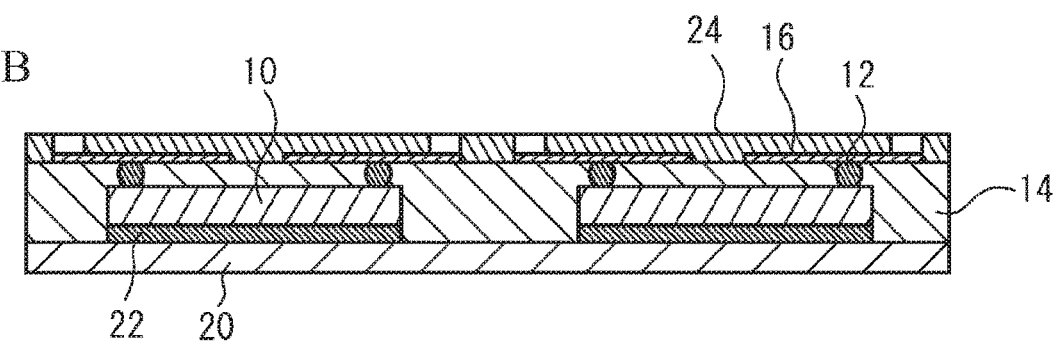

Next, as shown in FIG. 6B, the insulating portion 24 is formed so that the insulating portion 24 covers the entire side face and the entire upper face of the redistribution layer 16 and a region of the redistribution layer 16 where the outer connection electrode 18 is to be connected is exposed. An insulating sheet such as polyimide may be used as the insulating portion 24. It is possible to form the insulating portion 24 so that the region of the redistribution layer 16 where the outer connection electrode 18 is to be connected is exposed, by making a hole in advance at a region of the insulating sheet where the outer connection electrode 18 is to be formed. It is not always necessary that the insulating portion 24 is formed shown in FIG. 6B. However, it is possible to restrain the electrical short between each of the outer connection electrodes 18 if the insulating portion 24 is formed. And it is possible to improve the yield ratio and to reduce the manufacturing cost.

Figure 6C:
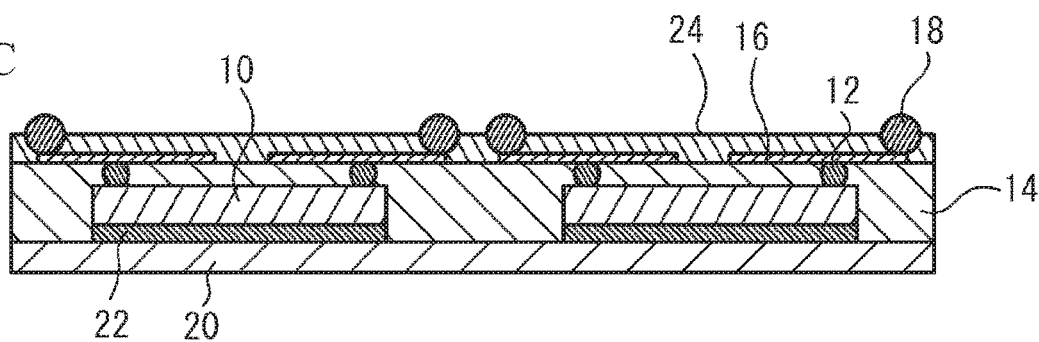

Next, as shown in FIG. 6C, the outer connection electrode 18 made of Au or a solder is formed on the upper face of the redistribution layer 16 so that the outer connection electrode 18 is electrically coupled to the bump electrode 12 via the redistribution layer 16. With the manufacturing method in accordance with the embodiment, it is possible to manufacture the semiconductor device that is to be electrically coupled to outside with one redistribution layer. It is therefore possible to reduce the quantity of components, compared to a semiconductor device that needs two redistribution layers in accordance with Document 2. It is therefore possible to reduce the manufacturing cost of the semiconductor device. Further, it is possible to reduce the height of the semiconductor device, because the semiconductor device needs only one redistribution layer.

Figure 7A:
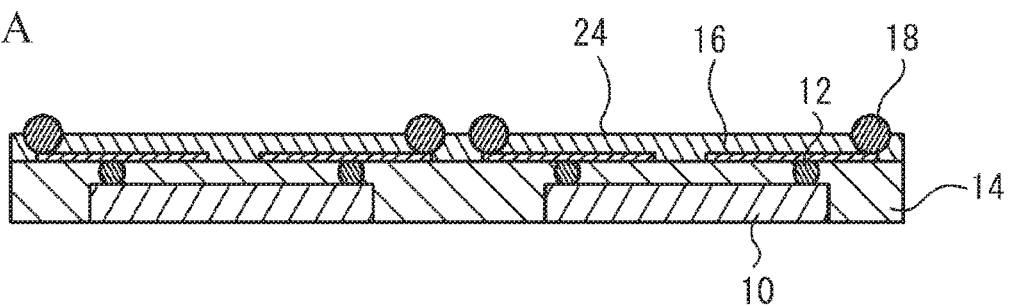
FIG. 7A and FIG. 7B illustrate a schematic cross sectional view accounting for the method of manufacturing the semiconductor device in accordance with the fourth embodiment.

The substrate 20 may be removed after the formation of the outer connection electrode 18 shown in FIG. 6C. FIG. 7A illustrates a schematic cross sectional view accounting for the step of removing the substrate 20. The substrate 20 may be removed with a machining process such as a grinding process. With the method, it is possible to further reduce the height of the semiconductor device, compared to the case where the substrate 20 is provided.

And the thickness of the semiconductor chip 10 and the molding portion 14 may be reduced in the step of removing the substrate 20 shown in FIG. 7A. That is, the thickness of the semiconductor chip 10 and the molding portion 14 may be controlled to be a desirable one in the step of removing the substrate 20 with the machining process or the like. With the method, it is possible to manufacture the semiconductor device having the thickness of approximately 0.5 mm, although the thickness of the conventional semiconductor device is limited to approximately 1 mm.

Figure 7B:
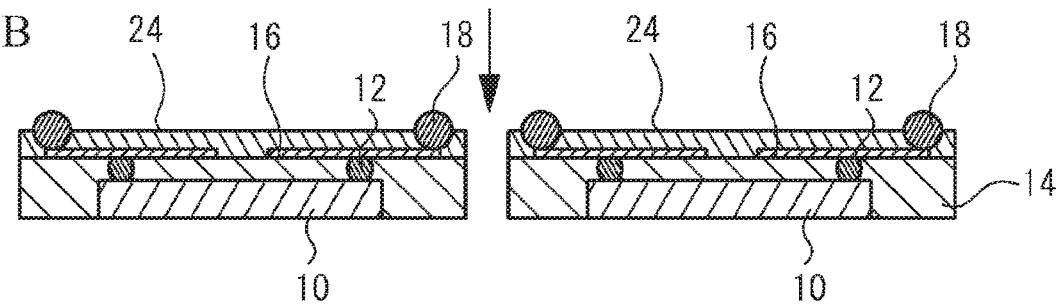
Figure 8:
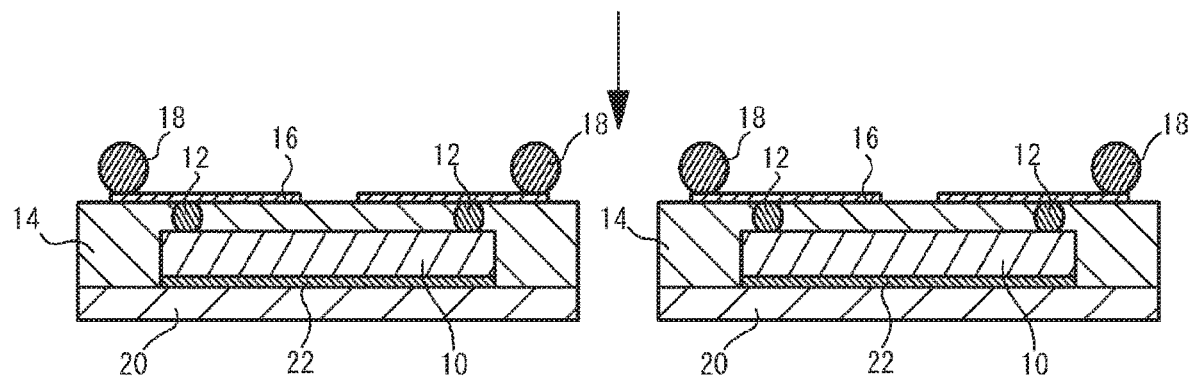
FIG. 8 illustrates a schematic cross sectional view accounting for the method of manufacturing the semiconductor device in accordance with the fourth embodiment.

And the semiconductor device may be individuated as shown in FIG. 7B after removing the substrate 20 shown in FIG. 7A. And the semiconductor device may be individuated as shown in FIG. 8 after forming the outer connection electrode 18 shown in FIG. 6C. With the methods, it is possible to manufacture the semiconductor device having one semiconductor chip 10. The substrate 20, the molding portion 14 and the insulating portion 24 may be cut off with dicing so that one semiconductor chip 10 is included in the semiconductor device, as a method of individuating the semiconductor device. In FIG. 7B and FIG. 8, the semiconductor device is individuated so that one semiconductor chip 10 is included in the semiconductor device. However, the semiconductor device may be individuated so that two semiconductor chips 10 are included in the semiconductor device.

The various aspects of the present invention are summarized below.

According to an aspect of the present invention, preferably, there is provided a semiconductor device including a semiconductor chip, a bump electrode, a molding portion, a redistribution layer, and an outer connection electrode. The bump electrode is provided on an upper face of the semiconductor chip. The molding portion encapsulates an entire side face of the semiconductor chip and seals the bump electrode so that a part of the bump electrode is exposed. The redistribution layer is provided on an upper face of the molding portion and is electrically coupled to the semiconductor chip via the bump electrode. The outer connection electrode is provided on an upper face of the redistribution layer and is electrically coupled to the bump electrode via the redistribution layer. With the structure, the semiconductor device may be electrically coupled to outside with one redistribution layer. Therefore, the semiconductor device needs fewer components, compared to a semiconductor device that needs two redistribution layers in accordance with Document 2. It is therefore possible to reduce a manufacturing cost of the semiconductor device. Further, it is possible to reduce a height of the semiconductor device compared to a semiconductor device having two redistribution layers, because the semiconductor device needs only one redistribution layer.

It is preferable that the upper face of the bump electrode and the upper face of the molding portion are flat. With the structure, it is easy to form the redistribution layer on the upper face of the molding portion with a sputtering to method, a plating method or the like. It is therefore possible to reduce the manufacturing cost of the semiconductor device.

It is preferable that an interval between each of the outer connection electrodes is larger than that between each of the bump electrodes. With the structure, it is easy to determine a position of the semiconductor device when the semiconductor device is connected to outside with the outer connection electrode, even if the semiconductor chip is very small. An electrical short between each of the outer connection electrodes is restrained when the interval between each of the outer connection electrodes is long. It is therefore possible to use a large outer connection electrode. It is therefore possible to improve connection strength between the semiconductor device and an external component.

The semiconductor device may further include a substrate that is fixed to a lower face of the semiconductor chip.

It is preferable that the substrate is a silicon substrate. A warpage amount of a silicon substrate caused by heat is less than that of a glass epoxy substrate. It is therefore possible to manufacture a plenty of the semiconductor devices all together if the silicon substrate is used. It is therefore possible to reduce the manufacturing cost of the semiconductor device.

The semiconductor device may further include an insulating portion. The insulating portion may cover an entire side face and an entire upper face of the redistribution layer. And a part of the outer connection electrode may be exposed. With the structure, it is possible to restrain the electrical short between the outer connection electrodes with the insulating portion. Therefore, the yield ratio of the semiconductor device may be improved. And the manufacturing cost of the semiconductor device may be reduced.

According to an aspect of the present invention, preferably, there is provided a method of manufacturing a semiconductor device including: forming a bump electrode on an upper face of a semiconductor chip; fixing the semiconductor chip to an upper face of a substrate; forming a molding portion that seals an entire of the semiconductor chip and seals the bump electrode so that a part of the bump electrode is exposed; forming a redistribution layer on an upper face of the molding portion so that the redistribution layer is electrically coupled to the bump electrode; and forming an outer connection electrode on an upper face of the redistribution layer so that the redistribution layer is electrically coupled to the bump electrode via the redistribution layer. With the method, it is possible to manufacture a semiconductor device that may be electrically coupled to outside with one redistribution layer. It is therefore possible to reduce a manufacturing cost of the semiconductor device, because the semiconductor device needs fewer components. Further, it is possible to reduce a height of the semiconductor device, because the semiconductor device needs only one redistribution layer.

It is preferable that the substrate is a silicon substrate. A warpage amount of a silicon substrate caused by heat is less than that of a glass epoxy substrate. It is therefore possible to manufacture a plenty of the semiconductor devices all together if the silicon substrate is used. It is therefore possible to reduce the manufacturing cost of the semiconductor device.

It is preferable that the step of forming the molding portion includes arranging the substrate in a mold having a recess and forming the molding portion so as to seal the semiconductor chip. With the method, it is possible to arrange a wafer to be divided into semiconductor devices in the mold having the recess. It is therefore not necessary to provide a mold according to the size of each semiconductor device having different size from each other, when a various kinds of the semiconductor devices are manufactured. And it is therefore possible to reduce the manufacturing cost of the semiconductor device.

It is preferable that the step of forming the molding portion includes fabricating the upper face of the molding portion and an upper face of the bump electrode to be flat. With the method, it is possible to form the redistribution layer accurately on the upper face of the molding portion with a sputtering method, a plating method or the like. It is therefore possible to improve the yield ratio of the semiconductor device. And it is possible to reduce the manufacturing cost of the semiconductor device.

The method may further include removing the substrate after forming the outer connection electrode. With the method, it is possible to reduce the height of the semiconductor device, because the substrate is removed.

It is preferable that the step of removing the substrate includes reducing a thickness of the semiconductor chip and a thickness of the molding portion. With the method, it is possible to reduce the height of the semiconductor device.

It is preferable that the method further includes forming an insulating portion after forming the redistribution layer, and the insulating portion is formed so that the insulating portion covers an entire side face and an entire upper face of the redistribution layer and a region of the redistribution layer where the outer connection electrode is to be connected is exposed. With the method, the electrical short between each of the outer connection electrodes is restrained, because the insulating portion is provided. It is therefore possible to improve the yield ratio of the semiconductor device. And it is possible to reduce the manufacturing cost of the semiconductor device.

The method may further include individuating the semiconductor device after forming the outer connection electrode. With the method, it is possible to manufacture the semiconductor chip having a desirable quantity of the semiconductor chip.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2007-048693 filed on Feb. 28, 2007, the entire disclosure of which is hereby incorporated by reference.

What is claimed is:

1. A semiconductor device, comprising:
a semiconductor chip;
a plurality of bump electrodes disposed on the semiconductor chip, first and second bump electrodes of the plurality of bump electrodes adjacent to one another, wherein a lateral distance between the first and second bump electrodes defines a first length;
a molding portion formed to encapsulate all side surfaces of the plurality of bump electrodes and the semiconductor chip and at least a portion of a top surface of the semiconductor chip, wherein the molding portion and the first and second bump electrodes share a flat coplanar top surface;
a silicon substrate affixed to a bottom surface of the semiconductor chip, wherein the molding portion does not encapsulate side surfaces or a lower surface of the silicon substrate;
a first redistribution layer formed directly on the molding portion and the first bump electrode and a second redistribution layer formed directly on the molding portion and the second bump electrode; and
first and second outer connection electrodes formed directly on the first and second redistribution layers respectively, wherein a lateral distance between the first and second outer connection electrodes defines a second length and the second length is greater than the first length.

2. The semiconductor device of claim 1, wherein each of the plurality of bump electrodes are partially spheroidal in shape, have flat top and bottom surfaces, and a height of approximately 300 micrometers.

3. The semiconductor device of claim 1, wherein the first and second redistribution layers are electrically insulated from one another.

4. The semiconductor device of claim 1, wherein the first bump electrode and the first outer connection electrode are physically and electrically coupled by the first redistribution layer, and wherein there is not another conductor layer between the first bump electrode and outer connection electrodes.

5. The semiconductor device of claim 1, further comprising:
a fixing portion disposed between the bottom surface of the semiconductor chip and the silicon substrate, wherein the molding portion encapsulates side surfaces of the fixing portion.

6. The semiconductor device of claim 1, wherein the lower surface of the silicon substrate has been machined to reduce an overall height of the semiconductor device.

7. The semiconductor device of claim 6, wherein the overall height of the semiconductor device is less than 1 millimeter (mm).

8. The semiconductor device of claim 6, wherein the overall height of the semiconductor device is 0.5 mm.

* * * * *